United States Patent
Horovitz

(10) Patent No.: US 7,373,568 B1
(45) Date of Patent: May 13, 2008

(54) SCAN INSERTION

(75) Inventor: Sorel Horovitz, Rachovot (IL)

(73) Assignee: Marvell Israel Ltd., Yokneam (IL)

( * ) Notice: Subject to any disclaimer, the term of this patent is extended or adjusted under 35 U.S.C. 154(b) by 841 days.

(21) Appl. No.: 10/349,441

(22) Filed: Jan. 21, 2003

(51) Int. Cl.
*G01R 31/28* (2006.01)

(52) U.S. Cl. ..................................... 714/726

(58) Field of Classification Search ............... 714/726
See application file for complete search history.

(56) References Cited

U.S. PATENT DOCUMENTS

| | | | |
|---|---|---|---|
| 5,471,152 A * | 11/1995 | Gheewala et al. ............ | 324/758 |
| 5,748,645 A | 5/1998 | Hunter et al. | |
| 5,783,960 A | 7/1998 | Lackey | |
| 5,886,901 A * | 3/1999 | Magoshi ..................... | 716/6 |
| 5,909,451 A * | 6/1999 | Lach et al. ................. | 714/726 |
| 6,059,836 A * | 5/2000 | Liguori ....................... | 703/23 |
| 6,106,568 A | 8/2000 | Beausang et al. | |
| 6,442,722 B1 * | 8/2002 | Nadeau-Dostie et al. ... | 714/731 |
| 6,484,294 B1 * | 11/2002 | Kiyoshige et al. ......... | 716/4 |
| 6,904,553 B1 * | 6/2005 | Brown ........................ | 714/731 |
| 2003/0145264 A1 * | 7/2003 | Siegel et al. ................ | 714/726 |
| 2005/0005216 A1 * | 1/2005 | Ghameshlu et al. ......... | 714/727 |

* cited by examiner

*Primary Examiner*—Cynthia Britt

(57) ABSTRACT

An integrated circuit comprises n storage elements, arranged to form a scan chain, that define m clock domains, wherein $m \geq 2$ and $n \geq m$. A clock driver is adapted to provide m domain clock signals and m switching units, each adapted to provide one of the m domain clock signals to the storage elements in a respective one of the m clock domains in response to a first state of a scan mode signal, and to provide a single scan clock signal to the n storage elements in the m clock domains in response to a second state of the scan mode signal. The n storage elements are adapted to interconnect in series in response to a scan shift signal and to serially shift bits through the scan chain in response to the scan clock signal when the scan to mode signal is in the second state.

13 Claims, 3 Drawing Sheets

SCAN INSERTION

FIELD OF THE INVENTION

The present invention relates generally to testing integrated circuits. More particularly, the present invention relates to scan testing of integrated circuits.

BACKGROUND

Modern integrated circuits generally comprise a large number of circuit elements. It is desirable to test these circuit elements in order to ensure the proper operation of the integrated circuit. However, the number of test points (that is, locations where signals can be measured) is limited by the number of terminals of the integrated circuit, which are vastly outnumbered by the number of circuit elements to be tested.

Consequently, designers of modern integrated circuits often employ a test technique referred to herein as "scan testing." FIG. 1 shows a conventional integrated circuit 100 designed to permit scan testing. According to this technique, integrated circuit 100 includes a number of storage elements 102 that can be loaded with a test vector. The test vector is a binary number that includes bits to be loaded into storage elements 102. Each storage element 102 comprises a flip-flop 118 and a switching unit such as a multiplexer 116. Each multiplexer 116 is controlled by a scan shift signal 104. When scan shift signal 104 is negated (for example, during normal operations), each multiplexer 116 gates signals from circuits such as optional logic circuits 120 to the flip-flop 118 in its storage element 102. However, when scan shift signal 104 is asserted (for example, during scan testing), each multiplexer 116 gates signals from another storage element 102 to the flip-flop 118 in its storage element 102, thereby causing the storage elements 102 to interconnect serially, forming a "scan chain."

During scan test, scan shift signal 104 is asserted, thereby forming the scan chain. Then the test vector (also referred to as "scan data") is shifted into the scan chain as scan data in signal 106 through the first storage element 102aa in the scan chain. Scan shift signal 104 is then negated, breaking the scan chain and restoring normal operational connections to storage elements 102. A clock driver 114 then toggles the clock signals 108 of the integrated circuit one or more times to simulate actual operation. Scan shift signal 104 is then asserted again, forming the scan chain again. Then the data in the storage elements 102 are then shifted out of the scan chain as scan data out signal 110 through the last storage element 102bn in the scan chain, and compared to a predetermined result vector to obtain a test result.

Many modern integrated circuits employ multiple clock signals, referred to herein as "domain clock signals" 108. The circuit elements driven by one clock signal 108 define a "clock domain" 112. Owing to design constraints (for example, when there is a lack of scan pins for scan chains in the design), it is often necessary to include multiple clock domains within a single scan chain. Referring to FIG. 1, clock domain 112a comprises storage elements 102aa through 102an, which are driven by domain clock signal 108a; and clock domain 112b comprises storage elements 102ba through 102bn, which are driven by domain clock signal 108b.

Within each clock domain 112, it is necessary to ensure that the clock signal 108 reaches each of the clocked circuit elements at substantially the same time. In addition, clock driver 114 can directly drive only a few circuit elements. The number of circuit elements a clock driver can drive is referred to as the clock driver's "fan-out." The number of circuit elements in a clock domain 112 that must be clocked by clock driver 114 generally far exceeds the fan-out of clock driver 114. To solve both of these problems, designers employ a number of delay elements between the clock driver and the clocked circuit elements. The collection of interconnected delay elements is referred to as a "clock tree." The process of determining the number and location of the delay elements for a clock domain 112 is referred to as generating a "clock tree" for the clock domain 112.

When generating a clock tree for a clock domain 112, a designer generally chooses the smallest number of delay elements that provide a common clock delay for each of the clocked circuit elements in the clock domain 112. As a result, the total clock delays usually differ for different clock domains 112. While this is not a problem during normal operation, it causes timing problems during scan test. One common solution is to isolate clock domains from each other by inserting a latch, referred to as a "lockup latch," between storage elements 102 that are connected in the scan chain but belong to different clock domains 112. Referring again to FIG. 1, a lockup latch (LUL) 122 is connected between storage elements 102an and 102ba, thereby isolating clock domains 112a and 112b from each other.

One disadvantage of this approach is that the designer must correctly identify the locations where lockup latches are needed. Much of the layout process for modern integrated circuits is automated using software layout tools. However, even these sophisticated layout tools occasionally fail to insert lockup latches where needed, resulting in lost design and test time. This problem is exacerbated when more than two clock domains (and therefore more than one lock-up latch) are present in the scan chain.

SUMMARY

In general, in one aspect, the invention features an integrated circuit comprising n storage elements selectively arranged to form a scan chain, the n storage elements defining m clock domains, wherein $m \geq 2$ and $n \geq m$; a clock driver adapted to provide m domain clock signals; and m switching units each adapted to provide one of the m domain clock signals to the storage elements in a respective one of the m clock domains in response to a first state of a scan mode signal, and to provide a single scan clock signal to the n storage elements in all of the m clock domains in response to a second state of the scan mode signal; and wherein the n storage elements in the scan chain are adapted to interconnect in series in response to a scan shift signal, and when the scan mode signal is in the second state, to serially shift bits through the scan chain in response to the scan clock signal.

Particular implementations can include one or more of the following features. Each of the m clock domains comprises one or more delay elements that impose predetermined delays on the signal provided by a respective one of the m switching units, and wherein the integrated circuit further comprises a further delay element adapted to delay the scan clock signal provided to a first one of the m clock domains by a difference between the one of the predetermined delays imposed in the first one of the m clock domains and the one of the predetermined delays imposed in a second one of the m clock domains. At least one of the n storage elements comprises a flip-flop clocked by a respective one of the m domain clock signals; and a further switching unit adapted to provide to the flip-flop (a) an output of another one of the n storage elements in the scan chain in response to a first state of the scan shift signal, and (b) an output of a circuit element not belonging to the scan chain in response to a second state of the scan shift signal.

In general, in one aspect, the invention features a method for testing an integrated circuit comprising n storage elements defining m clock domains each associated with a respective one of m domain clock signals, wherein m≧2 and n≧m, the method comprising providing respective ones of m single clock signals to the ones of the n storage elements in corresponding ones of the m clock domains; when a test mode of the integrated circuit is selected, causing the n storage elements to be interconnected in series to form a scan chain, and providing a single scan clock signal as each of the m single clock signals; and when an operational mode of the integrated circuit is selected, causing the n storage elements to be disconnected from each other, and providing respective ones of the m domain clock signals as the corresponding ones of the m single clock signals.

Particular implementations can include one or more of the following features. Implementations comprise, when the test mode is selected applying a test vector to a first one of the n storage elements in the scan chain, the test vector comprising a plurality of bits; and toggling the single scan clock signal one or more times; wherein the n storage elements shift the test vector into the scan chain in response to the toggling of the single scan clock signal, so that each of the bits in the test vector is stored in a respective one of a plurality of the n storage elements. Implementations comprise, when the test mode is selected toggling the single scan clock signal one or more times; and measuring the outputs of a last one of the n storage elements in the scan chain. Each of the m clock domains comprises one or more delay elements that impose predetermined delays on the corresponding one of the m single clock signals, and the method further comprises delaying the scan clock signal provided to a first one of the m clock domains by a difference between the one of the predetermined delays imposed in the first one of the m clock domains and the one of the predetermined delays imposed in a second one of the m clock domains.

In general, in one aspect, the invention features a method for designing an integrated circuit comprising providing a scan chain comprising n storage elements defining m clock domains, wherein m≧2 and n≧m; providing a clock driver adapted to provide m domain clock signals; and providing m switching units each adapted to provide one of the m domain clock signals to the storage elements in a respective one of the m clock domains in response to a first state of a scan mode signal, and to provide a single scan clock signal to the n storage elements in all of the m clock domains in response to a second state of the scan mode signal; and wherein the n storage elements in the scan chain are adapted to interconnect in series in response to a scan shift signal, and when the scan mode signal is in the second state, to serially shift bits through the scan chain in response to the scan clock signal.

Particular implementations can include one or more of the following features. Implementations comprise providing in each of the m clock domains one or more delay elements that impose predetermined delays on the signal provided by a respective one of the m switching units; and providing a further delay element adapted to delay the scan clock signal provided to a first one of the m clock domains by a difference between the one of the predetermined delays imposed in the first one of the m clock domains and the one of the predetermined delays imposed in a second one of the m clock domains. Implementations comprise providing, in at least one of the n storage elements, a flip-flop clocked by a respective one of the m domain clock signals; and a further switching unit adapted to provide to the flip-flop (a) an output of another one of the n storage elements in the scan chain in response to a first state of the scan shift signal, and (b) an output of a circuit element not belonging to the scan chain in response to a second state of the scan shift signal.

The details of one or more implementations are set forth in the accompanying drawings and the description below. Other features will be apparent from the description and drawings, and from the claims.

Figure 1:
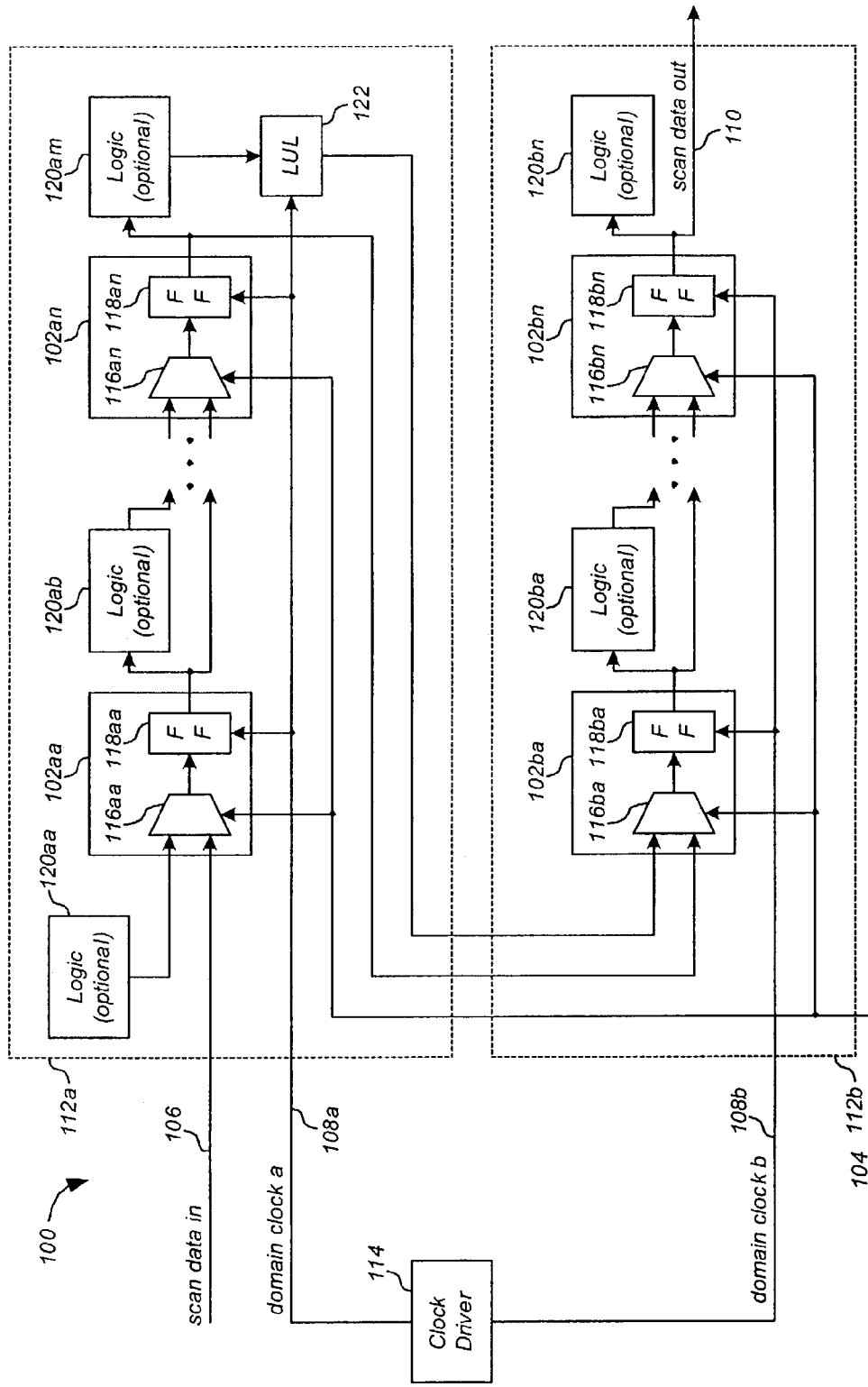
FIG. 1 shows a conventional integrated circuit designed to permit scan testing.

The leading digit(s) of each reference numeral used in this specification indicates the number of the drawing in which the reference numeral first appears.

DETAILED DESCRIPTION

Figure 2:
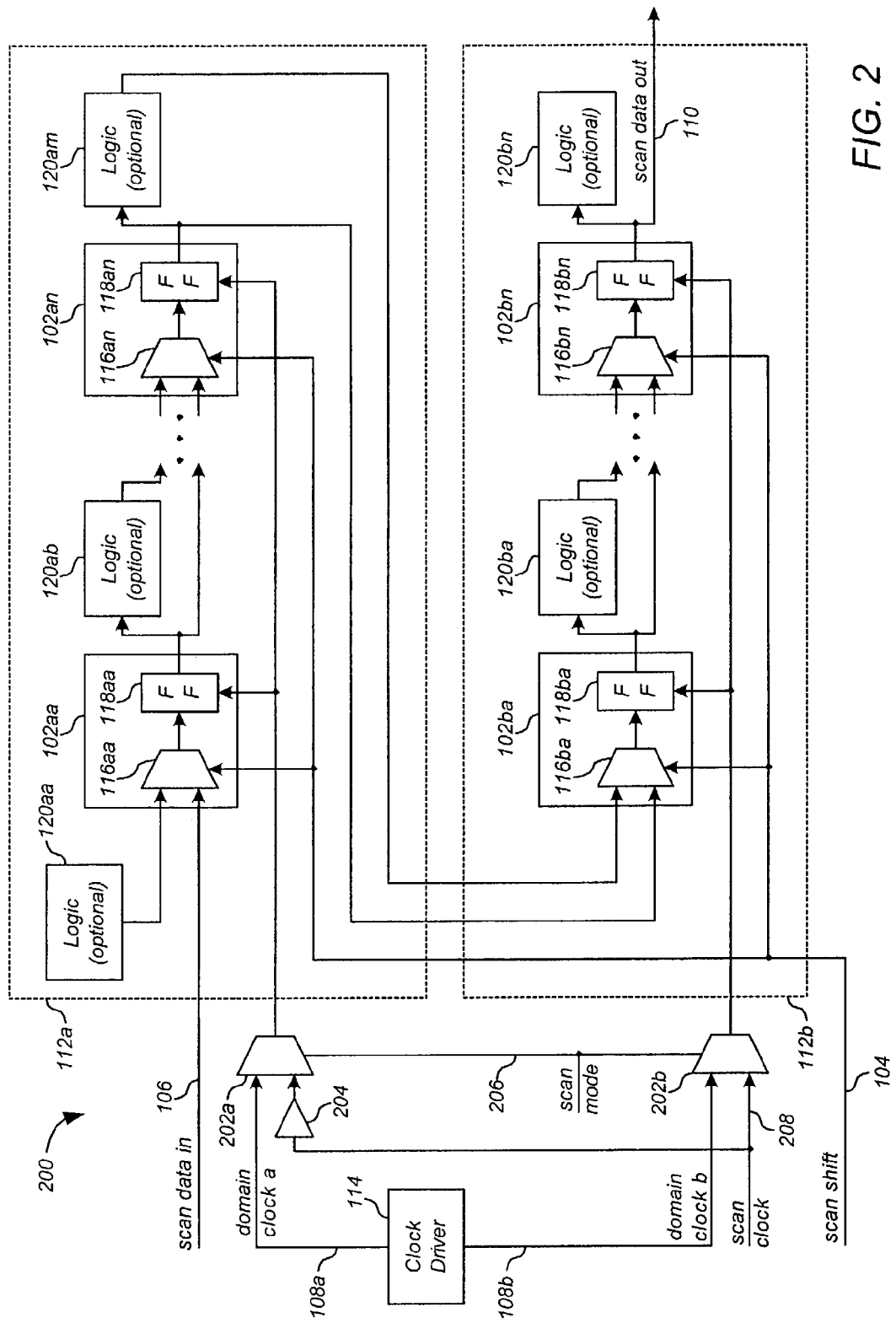
FIG. 2 shows an integrated circuit designed to employ scan testing according to a preferred embodiment of the present invention.

FIG. 2 shows an integrated circuit 200 designed to employ scan testing according to a preferred embodiment of the present invention. Integrated circuit 200 comprises a plurality of clocked circuit elements including storage elements 102 that form a scan chain for integrated circuit 200. The clocked circuit elements can comprise any of a number of digital electronic devices including logic circuits, microprocessors, memory devices, application-specific integrated circuits (ASICs), and the like. Storage elements 102 can comprise any of a number of digital electronic devices including registers, flip-flops, memory devices, and the like.

Storage elements 102 define multiple clock domains 112. For clarity, an embodiment comprising only two clock domains 112a and 112b is described, although other embodiments can comprise greater numbers of clock domains, as will be apparent to one skilled in the relevant arts after reading this description. Referring to FIG. 2, clock domain 112a comprises storage elements 102aa through 102an. Clock domain 112b comprises storage elements 102ba through 102bn.

In one embodiment, each storage element 102 comprises a flip-flop 118 and a multiplexer 116. Each multiplexer 116 is controlled by a scan shift signal 104. When scan shift signal 104 is negated (for example, during normal operations), each multiplexer 116 gates signals from circuits such as optional logic circuits 120 to the flip-flop 118 in its storage element 102. However, when scan shift signal 104 is asserted (for example, during scan test), each multiplexer 116 gates signals from another storage element 102 in the scan chain (or in the case of the first storage element in the scan chain, from the input to the scan chain) to the flip-flop 118 in its storage element 102, thereby causing the storage elements 102 to interconnect serially, forming the scan chain.

In some embodiments, the maximum delay imposed by the clock trees differs from clock domain to clock domain. In these embodiments, one or more delay elements 204 can be employed to delay scan clock signal 208 by predetermined amounts, so that all of the storage elements 102 in all of the clock domains 112 are clocked simultaneously by scan clock signal 208 during scan test.

Delay elements 204 are selected so that scan clock signal 208 reaches all of the clocked circuit elements in all of clock domains 112 at substantially the same time. In other words, the delays imposed by delay elements 204 compensate for the different total clock delays imposed on the clock signals in the different clock domains 112. In a scan chain comprising n clock domains 112, n–1 delay elements are needed. Referring to FIG. 2, a delay element 204 delays the scan clock signal 208 provided to clock domain 112a, thereby compensating for the difference in delays imposed by the clock trees in clock domains 112a and 112b.

All of the flip-flops 118 in a clock domain 112 receive a single clock signal, which of course may be propagated through a clock tree comprising one or more delay elements (not shown) to eliminate race conditions and meet fan-out limitations. The clock signal within each clock domain 112 is provided by a multiplexer 202 that is controlled by a scan mode signal 206, which has two states.

A first state of scan mode signal 206 (for example, when scan mode signal 206 is negated or a logic low) corresponds to the normal operation of integrated circuit 200. When scan mode signal 206 is in the first state, each multiplexer 202 provides the corresponding domain clock signal 108 to the clocked circuit elements in its clock domain 112. Referring to FIG. 2, when scan mode signal 206 is in the first state, flip-flops 118aa through 118an in clock domain 112a are clocked by domain clock signal 108a, and flip-flops 118ba through 118bn in clock domain 112b are clocked by domain clock signal 108b. The first state of scan mode signal 206 can also be used during scan testing, as described below.

A second state of scan mode signal 206 (for example, when scan mode signal 206 is asserted or a logic high) corresponds to a scan test operation of integrated circuit 200. When scan mode signal 206 is in the second state, each multiplexer 202 provides scan clock signal 208 (delayed by one of delay elements 204, if necessary) to the clocked circuit elements in its clock domain 112 as their clock signal. Referring to FIG. 2, when scan mode signal 206 is in the second state, flip-flops 118aa through 118an in clock domain 112a and flip-flops 118ba through 118bn in clock domain 112b are all clocked by scan clock signal 208.

Figure 3:
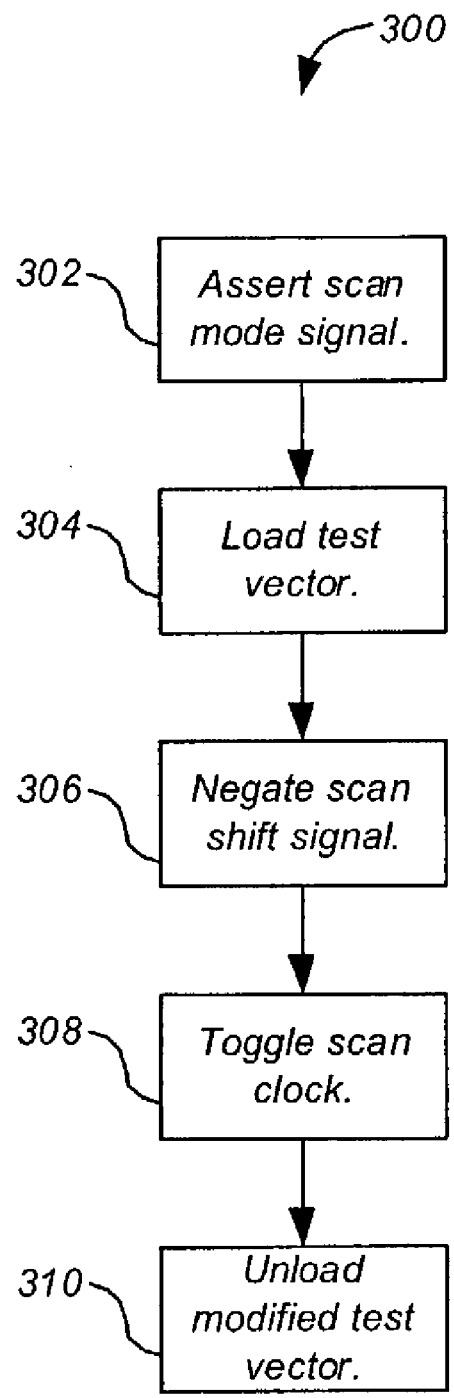
FIG. 3 depicts a scan test process of the integrated circuit of FIG. 2 according to a preferred embodiment.

FIG. 3 depicts a scan test process 300 of integrated circuit 200 according to a preferred embodiment. Although the steps of process 300 are described in a particular order, the steps can be performed in other orders, as will be apparent to one skilled in the relevant arts after reading this description.

Process 300 asserts scan mode signal 206 (step 302). In a preferred embodiment, scan mode signal 206 is asserted by changing scan mode signal 206 from its first state (corresponding to the normal operation of integrated circuit 200) to its second state (corresponding to the scan test operation of integrated circuit 200). Scan mode signal 206 is preferably provided to integrated circuit 200 through an external pin used for this purpose (for example by a test bed device) or through a tap device included in integrated circuit 200

In response to the second state of scan mode signal, each multiplexer 202 gates scan clock signal 208 to the clock inputs of the storage elements 102 within the clock domain 112 corresponding to that multiplexer 202. Referring to FIG. 2, in response to the second state of scan mode signal, multiplexer 202a gates scan clock signal 208 to the clock inputs of the storage devices 102aa through 102an within the clock domain 112a, and multiplexer 202b gates scan clock signal 208 to the clock inputs of the storage devices 102ba through 102bn within the clock domain 112b.

Process 300 loads the test vector (step 304). Referring to FIG. 2, process 300 loads the test vector in the following manner. Process 300 asserts scan shift signal 104, thereby forming the scan chain. When scan shift signal 104 is asserted, multiplexer 116aa gates scan data in signal 106 to flip-flop 118aa. The output of flip-flop 118aa is provided, possibly through other storage elements 102 within the scan chain, to multiplexer 116an which, under the control of scan shift signal 104, gates the received signal to the last flip-flop 118an in the scan chain in clock domain 112a. The output of flip-flop 118an is provided to the first storage element 102 in the scan chain in clock domain 112b. While scan shift signal 104 is asserted, multiplexer 116ba gates the received signal to flip-flop 118ba, and the output of flip-flop 118ba is provided, possibly through other storage elements 102 within the scan chain, to multiplexer 116bn, which gates the received signal to flip-flop 118bn. Of course, the progress of data through the scan chain is controlled by clocking storage elements 102.

Process 300 applies the test vector as scan data in signal 106 to the first storage element 102aa in the scan chain. The test vector preferably includes a bit corresponding to each storage element 102 in the scan chain, and is preferably provided to integrated circuit 200 by an external test bed device configured to test integrated circuit 200.

Process 300 toggles scan clock signal 208. Scan clock signal 208 includes a plurality of clock transitions, and is preferably provided by the test bed device. As the flip-flops 118 within storage elements 102 are clocked by scan clock signal 208, the test vector is shifted bit-wise through the scan chain until the bits of the test vector are stored in the desired storage elements 102 of the scan chain.

Process 300 negates scan shift signal 104 (step 306), thereby breaking the scan chain. In response, storage elements 102 resume their normal operational configuration. Referring to FIG. 2, in response to the negation of scan shift signal 104, multiplexer 116aa gates the output of an optional logic circuit 120aa to flip-flop 118aa, multiplexer 116ba gates the output of an optional logic circuit 120ba to flip-flop 118ba, and so on.

Clock driver 114 then toggles scan clock signal 208 once to simulate the actual operation of integrated circuit 200 (step 308).

Process 300 then unloads the test vector (step 310), which has been modified by the operation of integrated circuit 200 in response to toggling scan clock signal 208. Referring to FIG. 2, process 300 unloads the test vector in the following manner. Process 300 asserts scan shift signal 104, forming the scan chain again. Process 300 toggles scan clock signal 208, thereby shifting the contents of storage elements 102 out of integrated circuit 200 through the last storage element 102bn in the scan chain, and preferably into a test bed device for analysis, as scan data out signal 110. If multiple scan tests are to be performed, the next test vector can be loaded while the previous test vector is unloaded. The contents of the scan chain can be measured during unloading.

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations of the invention have been described. Nevertheless, it will be understood that various modifications may be made without departing from the spirit and scope of the invention. List any additional modifications or variations. Accordingly, other implementations are within the scope of the following claims.

What is claimed is:

1. An integrated circuit comprising:
    n storage elements selectively arranged to form a scan chain, the n storage elements defining m clock domains, wherein m≧2 and n≧m;
    a clock driver adapted to provide m domain clock signals; and
    m switching units each adapted to provide one of the m domain clock signals to the storage elements in a respective one of the m clock domains in response to a first state of a scan mode signal, and to provide a single scan clock signal to the n storage elements in all of the m clock domains in response to a second state of the scan mode signal; and
    wherein the n storage elements in the scan chain are adapted to interconnect in series in response to a scan shift signal, and when the scan mode signal is in the second state, to serially shift bits through the scan chain in response to the scan clock signal.

2. The integrated circuit of claim 1, wherein each of the m clock domains comprises one or more delay elements that impose predetermined delays on the signal provided by a respective one of the m switching units, and wherein the integrated circuit further comprises:
    a further delay element adapted to delay the scan clock signal provided to a first one of the m clock domains by a difference between the one of the predetermined delays imposed in the first one of the m clock domains and the one of the predetermined delays imposed in a second one of the m clock domains.

3. The integrated circuit of claim 1, wherein at least one of the n storage elements comprises:
    a flip-flop clocked by a respective one of the m domain clock signals; and
    a further switching unit adapted to provide to the flip-flop
    (a) an output of another one of the n storage elements in the scan chain in response to a first state of the scan shift signal, and
    (b) an output of a circuit element not belonging to the scan chain in response to a second state of the scan shift signal.

4. An integrated circuit comprising:
    n storage means for selectively forming a scan chain, the n storage means defining m clock domains, wherein m≧2 and n≧m;
    clock driver means for providing m domain clock signals; and
    m switching means each for providing one of the m domain clock signals to the storage means in a respective one of the m clock domains in response to a first state of a scan mode signal, and to provide a single scan clock signal to the n storage means in all of the m clock domains in response to a second state of the scan mode signal; and
    wherein the n storage means in the scan chain are adapted to interconnect in series in response to a scan shift signal, and when the scan mode signal is in the second state, to serially shift bits through the scan chain in response to the scan clock signal.

5. The integrated circuit of claim 4, wherein each of the m clock domains comprises one or more delay elements that impose predetermined delays on the signal provided by a respective one of the m switching means, and wherein the integrated circuit further comprises:
    delay means adapted to delay the scan clock signal provided to a first one of the m clock domains by a difference between the one of the predetermined delays imposed in the first one of the m clock domains and the one of the predetermined delays imposed in a second one of the m clock domains.

6. The integrated circuit of claim 4, wherein at least one of the n storage means comprises:
    flip-flop means clocked by a respective one of the m domain clock signals; and
    switching means for providing to the flip-flop means
    (a) an output of another one of the n storage means in the scan chain in response to a first state of the scan shift signal, and
    (b) an output of a circuit element not belonging to the scan chain in response to a second state of the scan shift signal.

7. A method for testing an integrated circuit comprising n storage elements defining m clock domains each associated with a respective one of m domain clock signals, wherein m≧2 and n≧m, the method comprising:
    providing respective ones of m single clock signals to the ones of the n storage elements in corresponding ones of the m clock domains;
    when a test mode of the integrated circuit is selected,
        causing the n storage elements to be interconnected in series to form a scan chain, and
        providing a single scan clock signal as each of the m single clock signals; and
    when an operational mode of the integrated circuit is selected,
        causing the n storage elements to be disconnected from each other, and
        providing respective ones of the m domain clock signals as the corresponding ones of the m single clock signals.

8. The method of claim 7, further comprising, when the test mode is selected:

applying a test vector to a first one of the n storage elements in the scan chain, the test vector comprising a plurality of bits; and toggling the single scan clock signal one or more times;

wherein the n storage elements shift the test vector into the scan chain in response to the toggling of the single scan clock signal, so that each of the bits in the test vector is stored in a respective one of a plurality of the n storage elements.

9. The method of claim 7, further comprising, when the test mode is selected:

toggling the single scan clock signal one or more times; and measuring the outputs of a last one of the n storage elements in the scan chain.

10. The method of claim 7, wherein each of the m clock domains comprises one or more delay elements that impose predetermined delays on the corresponding one of the m single clock signals, and wherein the method further comprises:

delaying the scan clock signal provided to a first one of the m clock domains by a difference between the one of the predetermined delays imposed in the first one of the m clock domains and the one of the predetermined delays imposed in a second one of the m clock domains.

11. A method for designing an integrated circuit comprising:

providing a scan chain comprising n storage elements defining m clock domains, wherein m≧2 and n≧m;

providing a clock driver adapted to provide m domain clock signals; and providing m switching units each adapted to provide one of the m domain clock signals to the storage elements in a respective one of the m clock domains in response to a first state of a scan mode signal, and to provide a single scan clock signal to the n storage elements in all of the m clock domains in response to a second state of the scan mode signal; and wherein the n storage elements in the scan chain are adapted to interconnect in series in response to a scan shift signal, and when the scan mode signal is in the second state, to serially shift bits through the scan chain in response to the scan clock signal.

12. The method of claim 11, further comprising:

providing in each of the m clock domains one or more delay elements that impose predetermined delays on the signal provided by a respective one of the m switching units; and providing a further delay element adapted to delay the scan clock signal provided to a first one of the m clock domains by a difference between the one of the predetermined delays imposed in the first one of the m clock domains and the one of the predetermined delays imposed in a second one of the m clock domains.

13. The method of claim 11, further comprising:

providing, in at least one of the n storage elements, a flip-flop clocked by a respective one of the m domain clock signals; and a further switching unit adapted to provide to the flip-flop (a) an output of another one of the n storage elements in the scan chain in response to a first state of the scan shift signal, and (b) an output of a circuit element not belonging to the scan chain in response to a second state of the scan shift signal.

* * * * *